United States Patent [19]

Fujimori et al.

[11] Patent Number: 5,206,214

[45] Date of Patent: Apr. 27, 1993

[54] METHOD OF PREPARING THIN FILM OF SUPERCONDUCTOR

[75] Inventors: Naoji Fujimori; Keizo Harada; Shuji Yazu; Tetsuji Jodai, all of Itami, Japan

[73] Assignee: Sumitomo Electric Industries, Ltd., Osaka, Japan

[21] Appl. No.: 833,576

[22] Filed: Feb. 10, 1992

Related U.S. Application Data

[63] Continuation of Ser. No. 649,121, Jan. 28, 1991, abandoned, which is a continuation of Ser. No. 463,908, Jan. 10, 1990, abandoned, which is a continuation of Ser. No. 200,275, May 31, 1988, abandoned.

[30] Foreign Application Priority Data

May 31, 1987 [JP] Japan .................... 62-136938
Jun. 4, 1987 [JP] Japan .................... 62-140610
Jun. 4, 1987 [JP] Japan .................... 62-140612

[51] Int. Cl.⁵ .................... C23C 14/34; H01L 39/24
[52] U.S. Cl. .................... 505/1; 204/192.24; 505/731
[58] Field of Search ............ 204/192.24; 505/1, 731, 505/816

[56] References Cited

U.S. PATENT DOCUMENTS 5,057,201 10/1991 Fujita et al. .................... 204/192.24

OTHER PUBLICATIONS

H. Adachi et al, *Jap. J. Appl. Phys.*, vol. 26, May 1987, pp. L709-L710.
H. Koinuma et al, *Jap. J. Appl. Phys.*, vol. 26, May 1987, pp. L763-L765.
Y. Enomoto et al, *Jap. J. Appl. Phys.*, vol. 26, Jul. 1987, pp. L1248-L1250.
H. Ohkuma et al, *Jap. J. Appl. Phys.*, vol. 26, Sep. 1987, pp. L1484-L1486.
T. Aida et al., *Jap. J. Appl. Phys.*, vol. 26, Sep. 1987, pp. L1489-L1491.

*Primary Examiner*—Aaron Weisstuch
*Attorney, Agent, or Firm*—Pennie & Edmonds

[57] ABSTRACT

A method for preparing a thin film of superconductor on a substrate by sputtering. A target prepared from an oxide containing Ba, Y, and Cu in atomic ratios Cu/Y of 2.5 to 3.5 and Ba/Y of 1.8 to 2.2 is employed to form by sputtering a superconducting thin film on a substrate at a temperature of 600° to 800° C. in an atmosphere having total gas pressure of $1 \times 10^{-2}$ to $5 \times 10^{-2}$ Torr. and containing Ar and $O_2$ with an $O_2$ content of 5 to 80 vol. %. The thin film thus formed is subjected to heat treatment at a temperature of 600° to 930° C. for 1 to 30 hours. The thin film after the heat treatment is cooled at a rate not more than 4° C./min. The film forming surface of the substrate is chosen from the (100) surface or the (110) surface of a single crystal substrate which is lattice-matched with the (100) surface or the (110) surface of crystalline $Y_1Ba_2Cu_3O_{7-n}$, where n represents a number in the range $0 \leq n < 1$.

25 Claims, 1 Drawing Sheet

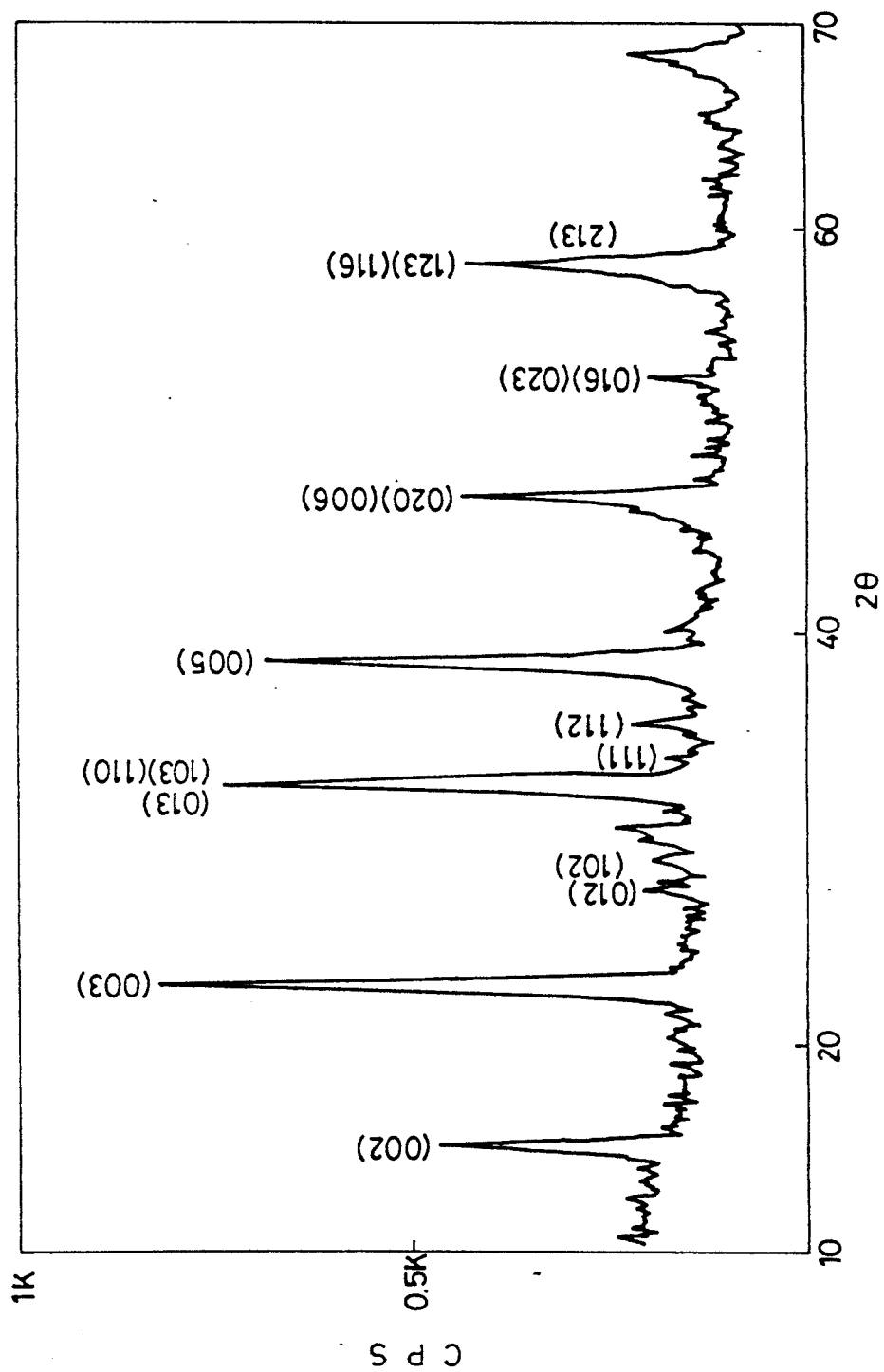

METHOD OF PREPARING THIN FILM OF SUPERCONDUCTOR

This is a continuation of application Ser. No. 07/649,121 filed Jan. 28, 1991, now abandoned, which is a continuation of application Ser. No. 07/463,908, filed Jan. 10, 1990, now abandoned, which is a continuation of application Ser. No. 07/200,275, filed May 31, 1988, now abandoned.

BACKGROUND OF THE INVENTION

1. Field of the Invention

The present invention relates to a method for preparing an oxide superconducting thin film on a substrate, and more particularly, it relates to a method for preparing a Y-Ba-Cu-O oxide superconducting thin film.

2. Description of the Prior Art

Superconductivity, which is explained as phase transition of electrons, is a phenomenon by which a conductor loses all resistance to electric current under specific conditions and exhibits complete diamagnetism. In a superconductor, electric current of high density permanently flows with absolutely no power loss. For example, losses of about 7%, which are typical in power transmission, could be greatly reduced if superconductive power transmission were employed. Further, the availability of superconductive electromagnets for generating strong magnetic fields will facilitate nuclear fusion reactions, which is said to require electric power in excess of generated energy for development, and in MHD power generation, electric motors, etc. used in the field of power generation, for example.

Further expected is application of superconductors to a power source for a magnetic levitation train, an electromagnetically driven ship or the like, as well as for NMR, pimeson apparatus and high-energy experimental apparatus, etc., and use in the fields of instrumentation and medical care.

In addition to the aforementioned uses in large apparatus, superconductive materials can be adapted to provide various types of smaller superconducting devices. A typical example of such superconducting devices is that employing the Josephson effect, through which a quantum effect is macroscopically developed by applied current when superconductive materials are weakly joined with each other. A tunnel junction type Josephson device, which has a small energy gap between superconductive materials, is expected to be used as a switching element of extremely high speed and low power consumption. Further, application of the Josephson device to a supersensitive sensor for magnetic fields, microwaves, radioactive rays or the like is also expected. Further, as the degree of integration of an electronic circuit is improved, power consumption per unit area approaches the limit of cooling ability. Thus, development of a superconducting device for a very high speed computer is necessary.

In spite of various efforts, superconduction critical temperatures $T_c$ of conventional superconductive materials remained below 23 K, that of $Nb_3Ge$, for many years. However, it was discovered at the end of 1986 that sintered bodies of $K_2NiF_4$ type oxides such as $[La,Ba]_2CuO_4$ and $[La,Sr]_2CuO_4$ superconduct at higher critical temperatures, thereby opening the possibility of non-cryogenic superconductivity. It has been observed that these substances superconduct at a critical temperatures of 30 to 50 K, which are much higher than those of the conventional materials. Some of these ceramic substances superconduct at temperatures exceeding 70 K. However, such superconductive materials, being sintered bodies which may contain unreacted particles, and which tend to be heterogeneous in composition and structure, cannot be directly applied to electronic devices. Such materials must be provided in thin film form with adequately controlled composition and structure for application to electronic devices.

Further, it has been impossible to apply superconducting thin films heretofore developed, which have low critical current density values ($J_c$) of several hundred A/cm², to practical devices. Manufacture of an elongated superconducting member by evaporation of a superconductive material onto a wire or rod, or a tapelike member of metal or the like, is required. Thus, use of an evaporation technique is required for the superconductive material in such manufacturing process.

SUMMARY OF THE INVENTION

An object of the present invention is to provide a method of stably manufacturing a thin film of a superconductive material which has a high critical temperature $T_c$ and practical critical current density $J_c$ as well as homogeneous composition and structure.

The method according to the present invention comprises forming a thin film, employing a target prepared from an oxide containing Ba, Y and Cu in atomic ratios Cu/Y of 2.5 to 3.5 and Ba/Y of 1.8 to 2.2 for forming a superconducting thin film on a substrate by sputtering in an atmosphere having total gas pressure of $1 \times 10^{-2}$ to $5 \times 10^{-2}$ Torr. and containing Ar and $O_2$ with an $O_2$ content of 5 to 80 vol. %, preferably 5 to 50 vol. %, heat treating the thin film thus formed, and cooling the thin film after the heat treatment at a rate of not more than 4° C./min.

According to the first aspect of the present invention, the superconducting thin film is formed on the substrate at a temperature of 600° to 800° C.

In the first aspect, the substrate may be a metal, a ceramic material, an oxide, an insulator or the like. The material for the substrate is preferably selected from MgO, $SrTiO_3$, $Al_2O_3$, sapphire, $SiO_2$, quartz, yttrium stabilized zirconia (YSZ) and ZnO. A particularly preferable material is MgO or $SrTiO_3$.MgO and $SrTiO_3$ are similar in thermal expansion coefficient to the deposited thin film, and hence no unwanted stress is applied to the thin film to fracture the same during sputtering and heat treatment.

According to a second aspect of the present invention, the superconducting thin film is formed on the (100) surface of a single crystal substrate which is lattice-matched with the (100) surface of crystalline $Y_1Ba_2Cu_3O_{7-n}$, where n represents a number in the range $0 \leq n < 1$. In this aspect, the c-axis of the crystalline material forming the thin film can be oriented perpendicular to the surface of the substrate, whereby c-axis orientation of the thin film can be improved to increase critical current density. Also, in this aspect, the substrate is preferably a single crystal substrate such as MgO, which has a lattice constant approximately that of the a-axis or b-axis of the (100) surface of the crystalline material $Y_1Ba_2Cu_3O_{7-n}$.

According to a third aspect of the present invention, the superconducting thin film is formed on the (110) surface of a single crystal substrate which is lattice matched with the (110) surface of the crystalline substance $Y_1Ba_2Cu_3O_{7-n}$. In this way, the c-axis of the crystalline material forming the thin film can be oriented parallel to the surface of the substrate, to be isotropic with respect to the plane of the surface, so that electric current of high density can flow in the thickness dimension of the film.

According to the present invention, the distance between the target and the substrate is preferably 20 to 45 mm when the superconducting thin film is formed. The deposited thin film is heat-treated preferably at 600° to 930° C., more preferably at 600° to 800° C. The time of the heat treatment is preferably 1 to 30 hours, more preferably 10 to 30 hours.

The superconducting thin film formed according to the present invention may be of a Y-Ba-Cu-O oxide. Particularly preferable is a superconducting thin film of composition $Y_1Ba_2Cu_3O_{7-n}$, $0 \leq n < 1$. Further, such an oxide is preferably of perovskite structure or pseudo-perovskite crystal structure.

Superconductivity of the thin film obtained according to the inventive method is greatly influenced by oxygen deficiency in the crystal. In order to properly control such oxygen deficiency in the crystal, the heat treatment step is preferably performed in an atmosphere containing $O_2$.

In a preferred embodiment of the present invention, the sputtering process is performed by magnetron sputtering. A thin film provided by magnetron sputtering is particularly preferable in crystal structure, the state of oxygen deficiency and the like, necessary to attain excellent superconductivity. The present invention makes it possible to obtain a superconducting oxide thin film which has higher critical current density $J_c$ than a conventional superconductor. Thus, the present invention can be effectively used to apply a superconductor to a thin film device, such as a Matisoo switching device, that is, a Josephson device, an Anacker memory device or a superconducting quantum interferometer device (SQUID), for example.

These and other objects, features, aspects and advantages of the present invention will become more apparent from the following detailed description of the present invention when taken in conjunction with the accompanying drawing.

BRIEF DESCRIPTION OF THE DRAWING

FIG. 1 illustrates an X-ray diffraction pattern of a superconducting thin film obtained by an embodiment according to the method of the present invention.

DESCRIPTION OF THE PREFERRED EMBODIMENT

Quantities of $Y_2O_3$, BaO, and CuO were weighed out to be in atomic ratios Cu/Y of 3.2 and Ba/Y of 2.15, and fired in the atmosphere at 900° C. The fired body thus obtained was pulverized into a powder, which was employed as a target to form a thin film by high-frequency magnetron sputtering in an oxygen/argon atmosphere. Film forming conditions were as follows:

Total Pressure: $2 \times 10^{-2}$ Torr.
$O_2$:Ar ratio: 0.16
Substrate: MgO single crystal with (100) surface employed as film forming surface
Substrate Temperature: 720° C.

A thin film 1000 A thick was obtained. This film was heated to 700° C. in flowing oxygen and maintained at this temperature for 24 hours, and thereafter cooled to room temperature at a cooling rate of 3° C./min.

The thin film thus obtained was considered to be of $Y_1Ba_2Cu_3O_{7-n}$, which was a polycrystalline substance having its c-axis oriented perpendicular to the surface of the substrate. FIG. 1 shows an X-ray diffraction pattern of the thin film obtained in the aforementioned manner. This X-ray diffraction pattern was obtained using K alpha rays on Cu, employing an X-ray diffraction apparatus by Rigaku Denki.

A sample 1 mm in width and 1000 A in thickness was cut from the thin film, and subjected to measurement of superconductive characteristics by a four terminal method. The results were as follows:
$T_c$: 85 K
$J_c$: 150,000 A/cm$^2$ Consequently, it has been proved that the crystal structure of a superconductive thin film can be controlled to be in c-axis orientation and its state of oxygen deficiency can be properly controlled according to the present invention, to obtain a superconducting thin film of excellent superconductivity having extremely high critical current density $J_c$, in particular.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for preparing a superconductive thin film comprising the steps of:
   preparing a target from the oxides of Ba, Y, and Cu in atomic ratio of Cu/Y of 2.5 to 3.5 and Ba/Y of 1.8 to 2.2;
   sputtering said target to form a superconducting thin film on a substrate at a temperature of 650° to 750° C., said sputtering step being carried out in an atmosphere having a total gas pressure of $1 \times 10^{-1}$, to $5 \times 10^{-2}$ Torr and containing Ar and $O_2$ content with an $O_2$ content of 16 to 80 vol. %;
   performing a heat treatment at 600° to 800° C. of said thin film thus formed; and
   cooling said thin film after said heat treatment at a rate of up to 4° C./min.

2. A method in accordance with claim 1, wherein said heat treatment is performed for 1 to 30 hours.

3. A method in accordance with claim 1, wherein said heat treatment is performed for 10 to 30 hours.

4. A method in accordance with claim 1 wherein said sputtering is performed in an atmosphere containing Ar and $O_2$ with an $O_2$ context of 16 to 50 vol. %.

5. A method in accordance with claim 1, wherein said substrate is selected from the group of MgO, SrTiO$_3$, Al$_2$O$_3$, sapphire, SiO$_2$, quartz, YSZ, and ZnO.

6. A method in accordance with claim 1, wherein said substrate is MgO or SrTiO$_3$.

7. A method in accordance with claim 1, wherein said superconducting thin film is formed on the (110) surface of a single crystal substrate of MgO or SrTiO$_3$.

8. A method in accordance with claim 1, wherein said superconducting thin film is formed on the (110) surface of a single crystal substrate of MgO or SrTiO$_3$.

9. A method in accordance with claim 1, wherein the distance between said target and said substrate is 20 to 45 mm.

10. A method in accordance with claim 1, wherein a superconducting thin film of Y-Ba-Cu-O is formed.

11. A method in accordance with claim 1, wherein a superconducting thin film of composition $Y_1Ba_2$-

$Cu_3O_{7-n}$ is formed, where n represents a number in the range of $0 \leq n < 1$.

12. A method in accordance with claim 1, wherein a superconducting thin film of an oxide having perovskite or pseudo-perovskite crystal structure is formed.

13. A method in accordance with claim 1, wherein said heat treatment is performed in an atmosphere containing $O_2$.

14. A method in accordance with claim 1, wherein said superconductive thin film is formed by magnetron sputtering.

15. A method of preparing a superconducting thin film comprising the steps of:
preparing a target from oxides of Ba, Y, and Cu in atomic ratios of Cu/Y of 2.5 to 3.5 and Ba/Y of 1.8 to 2.2;
sputtering said superconducting thin film of the material of said target onto the (100) surface of a single heated crystal substrate which is lattice-matched with the (100) surface of crystalline $Y_1Ba_2Cu_3O_{7-n}$, wherein n represents a number of the range $0 \leq n \leq 1$, said sputtering being carried out in an atmosphere having a total gas pressure of $1 \times 10^{-2}$ to $5 \times 10^{-2}$ Torr and containing Ar and $O_2$ with an $O_2$ content of 16 to 80 vol. %;
heat treating at 600° to 800° C. the thin film thus formed; and
cooling said thin film after said heat treatment step at a rate of up to 4° C./min.

16. A method in accordance with claim 15, wherein the (100) surface of said single crystal substrate has a lattice constant approximately that of the a-axis or b-axis of the (100) surface of crystalline $Y_1Ba_2Cu_3O_{7-n}$, where n represents a number in the range $0 \leq n < 1$.

17. A method in accordance with claim 15, wherein said substrate is MgO.

18. A method in accordance with claim 15, wherein the distance between said target and said substrate is 20 to 45 mm.

19. A method in accordance with claim 15, wherein said heat treatment is performed for 10 to 30 hours.

20. A method in accordance with claim 15, wherein said sputtering is performed in an atmosphere containing Ar and $O_2$ with an $O_2$ content of 16 to 50 vol. %.

21. A method in accordance with claim 15, forming a superconducting thin film of Y-Ba-Cu-O.

22. A method in accordance with claim 15, wherein a superconducting thin film of composition $Y_1Ba_2Cu_3O_{7-n}$ is formed, where n represents a number in the range $0 \leq n < 1$.

23. A method in accordance with claim 15, wherein a superconducting thin film of an oxide having perovskite or pseudo-perovskite crystal structure is formed.

24. A method in accordance with claim 15, wherein said heat treatment is performed in an atmosphere containing $O_2$.

25. A method in accordance with claim 15, wherein said superconducting thin film is formed by magnetron sputtering.

* * * * *